(12) United States Patent
Kawasaki et al.

(10) Patent No.: US 7,030,429 B2
(45) Date of Patent: Apr. 18, 2006

(54) HETERO-JUNCTION BIPOLAR TRANSISTOR AND THE METHOD FOR PRODUCING THE SAME

(75) Inventors: Takeshi Kawasaki, Yokohama (JP); Masaki Yanagisawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 340 days.

(21) Appl. No.: 10/620,805

(22) Filed: Jul. 17, 2003

(65) Prior Publication Data

US 2005/0230707 A1    Oct. 20, 2005

(30) Foreign Application Priority Data

Jul. 17, 2002    (JP)    ............................... 2002-208843

(51) Int. Cl.
*H01L 29/737*    (2006.01)
*H01L 23/58*    (2006.01)

(52) U.S. Cl. ...................................... 257/197; 257/646

(58) Field of Classification Search ......... 257/197–201
See application file for complete search history.

(56) References Cited

U.S. PATENT DOCUMENTS

| 6,885,042 B1 * | 4/2005 | Yanagisawa et al. ....... 257/197 |
| 6,888,180 B1 * | 5/2005 | Kotani et al. ................ 257/191 |
| 6,933,545 B1 * | 8/2005 | Kawasaki et al. .......... 257/197 |
| 2002/0105011 A1 | 8/2002 | Yaegashi et al. |

* cited by examiner

*Primary Examiner*—Cuong Nguyen
(74) *Attorney, Agent, or Firm*—McDermott Will & Emery LLP

(57) ABSTRACT

This invention provides a hetero-junction bipolar transistor with a new structure that prevent the corrector resistance from increasing as shrinking the size of the transistor. The bipolar transistor according to the invention comprises a substrate 2, a collector layer 6a, a base layer 10a and an emitter layer 12a. The collector layer 6a is formed on a first region of the substrate. The base layer 10a is formed on a second region of the substrate and has band gap energy smaller than that of the collector layer 6a and that of the emitter layer 12a. The plan shape of the first region is substantially same as that of the second region.

4 Claims, 16 Drawing Sheets

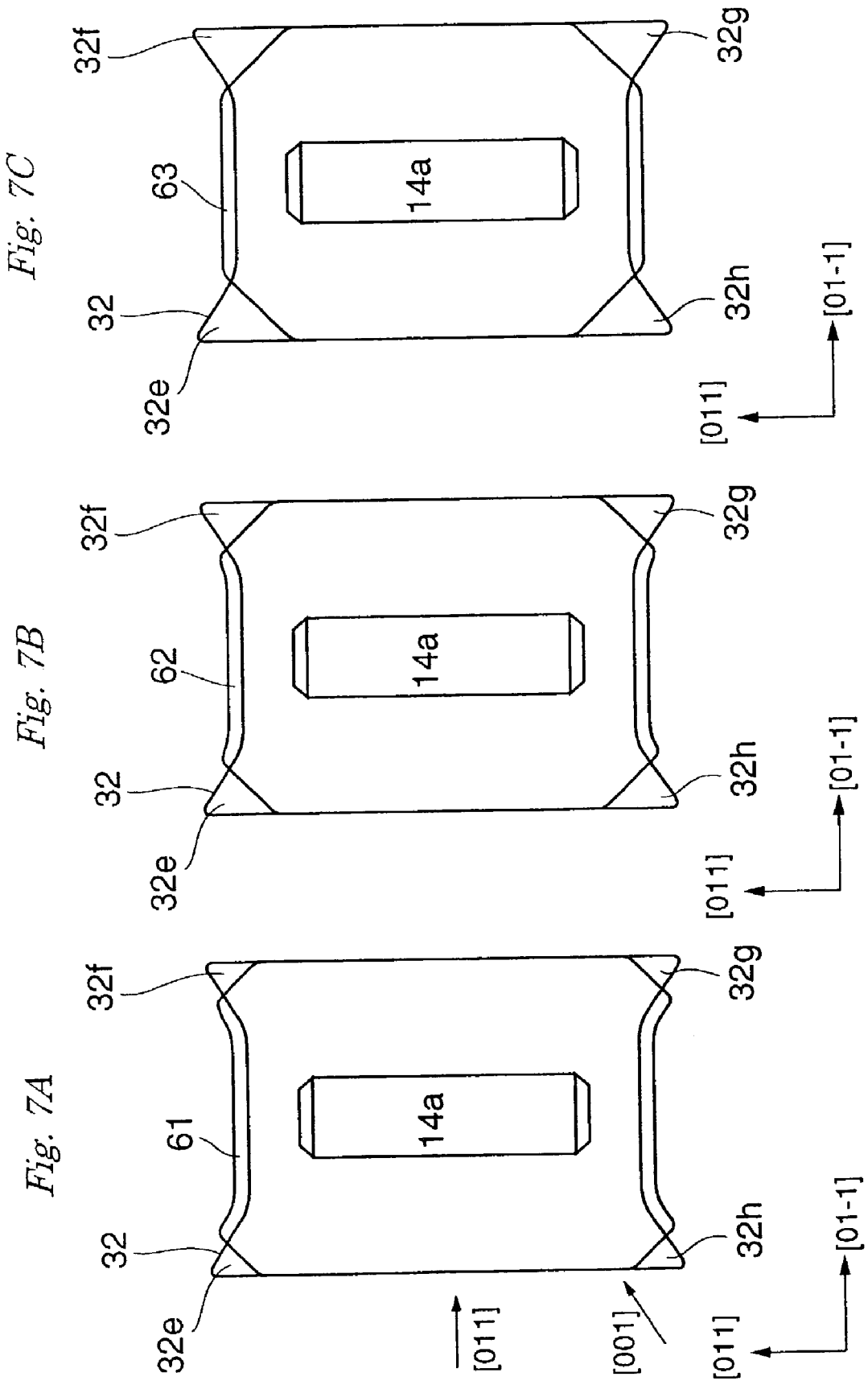

[011]
⊙ ⟶ [01-1]

[01-1]
⊙ ⟶ [011]

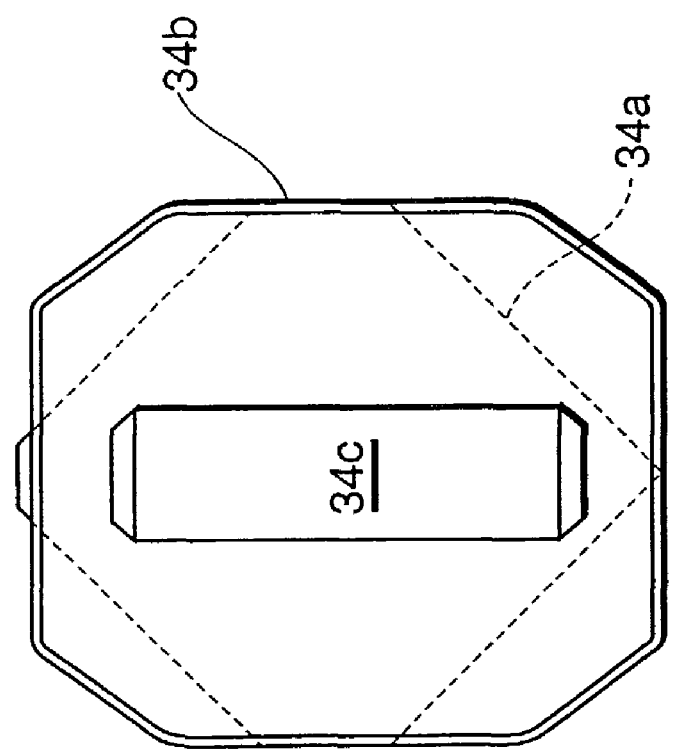
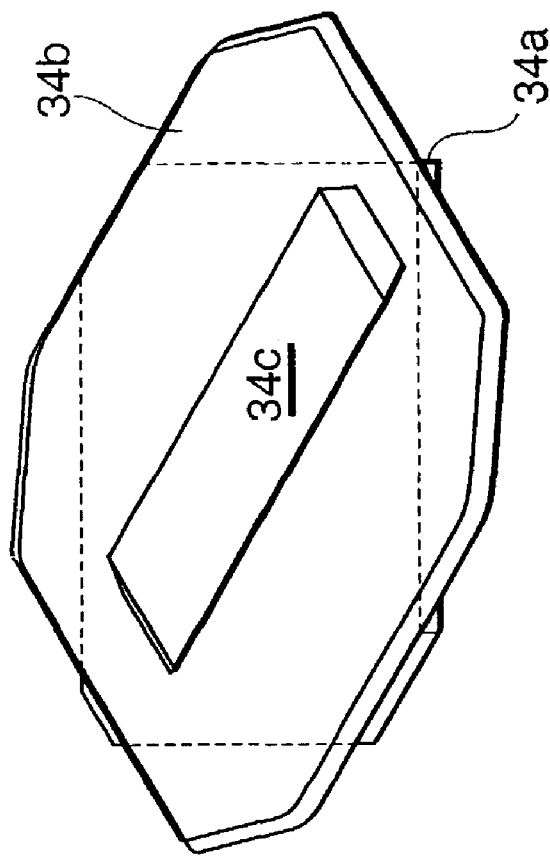
Fig. 10B
Fig. 10A

[011] ⊙ → [01-1]

[01-1] ⊙ → [011]

[011]
⊙ ⟶ [01-1]

[01-1]
⊙ ⟶ [011]

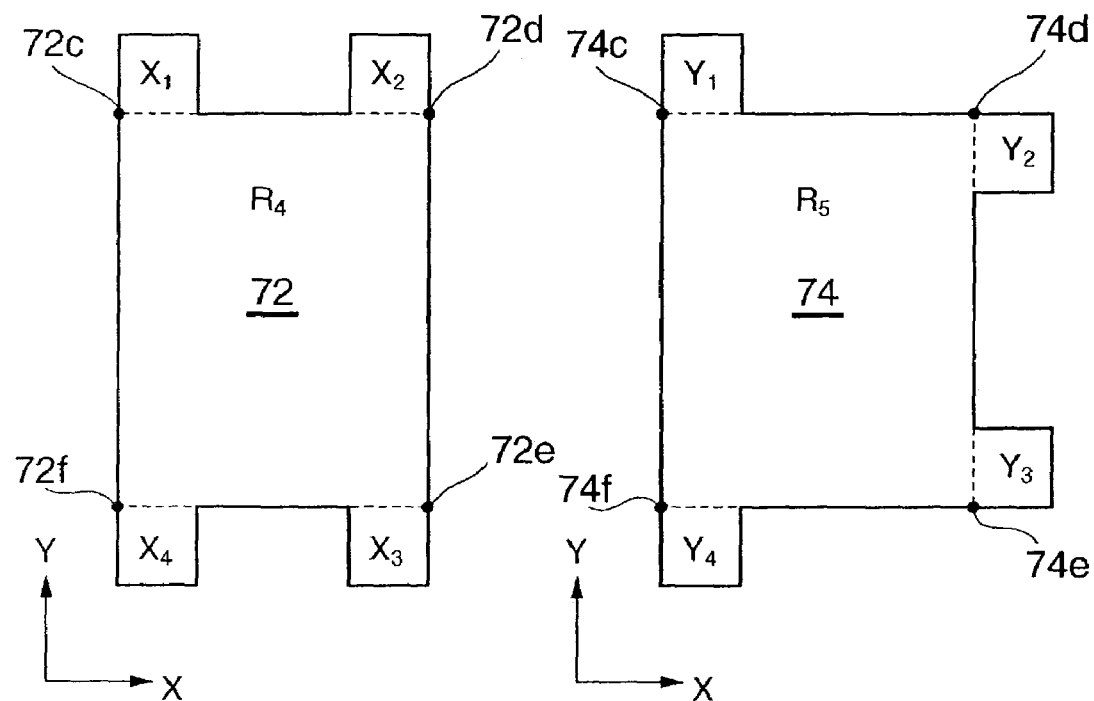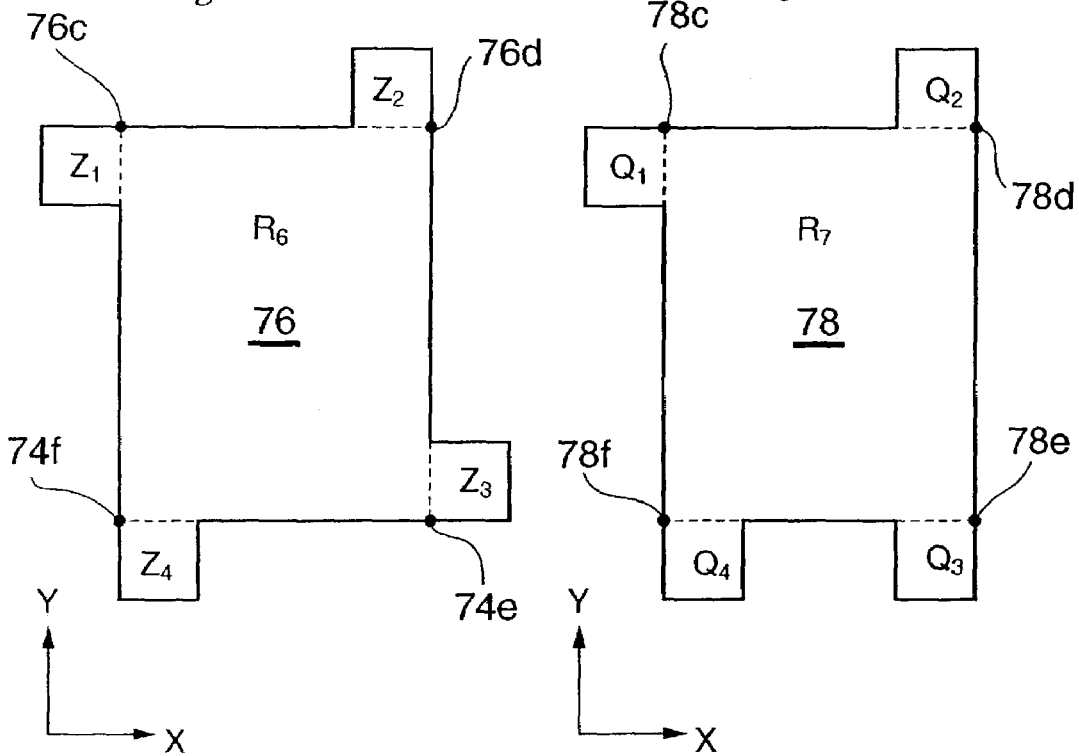

HETERO-JUNCTION BIPOLAR TRANSISTOR AND THE METHOD FOR PRODUCING THE SAME

BACKGROUND OF THE INVENTION

1. Field of the Invention

This invention relates to a hetero-junction bipolar transistor and a method for producing the hetero-junction bipolar transistor.

2. Related Prior Art

A hetero-junction bipolar transistor (HBT) is made of group III–V compound semiconductors and shows a high current gain, a superior high-frequency performance and a high-speed switching capability. One type of the HBT has an emitter with band gap energy greater than that of a base. Another type of the HBT is a hetero junction transistor with a double hetero junction (DHBT), in which the band gap energy of the base is smaller than that of the emitter and the collector.

To enhance the high frequency performance of the HBT requires shrinking a size of the transistor. Typical DHBT has a sub-collector made of InGaAs, a collector made of InP, a base made of InGaAs, an emitter made of InP and an emitter-contact made of InGaAs, and these layers are grown on an InP substrate. When the collector made of InP is etched with an etching mask same as that used at the etching for the base layer, a size of the collector layer becomes smaller than that of the base layer because a thickness of the collector layer is in general thicker than that of the base layer and a side etching of the collector layer appears. Due to this side etching of the collector, an intrinsic collector, through which a current from the emitter flows, becomes small when making the small-sized transistor, thereby increases a collector resistance, which reduces the current gain, the high frequency performance and the high speed switching. One object of the present invention is to provide a HBT, which avoids the increasing of the collector resistance, and a method for producing the HBT.

SUMMARY OF THE INVENTION

One feature of the present HBT comprises a semiconductor substrate, a collector layer, a base layer and an emitter layer. Band gap energy of the base layer is smaller than that of the collector layer and the emitter layer. The collector layer is defined by a first type of sides extending along [011] crystal orientation, a second type of sides along [01-1] orientation, and a third type of sides along [010] orientation shorter than the first type of sides and the second type of sides.

Another feature of the HBT according to the present invention is that the HBT comprises the base layer that has a plan shape defined by a fourth type of sides extending along [011] orientation, a fifth type of sides along [01-1] orientation, and sixth type of sides along [010] orientation. The ratio of a length of the third type of sides of the collector layer to than of the sixth type of sides of the base layer is greater than 0.9 and smaller than 1.5.

Still anther feature of the HBT according to the present invention is that the HBT comprises a semiconductor substrate and a multiple layers of a collector layer, a base layer and an emitter layer, they are disposed on the semiconductor substrate. Band gap energy of the base layer is smaller than that of the collector layer and that of the emitter layer. The collector layer is formed on a first region of the substrate and defined by a first type of sides extending along [011] orientation, a second type of sides along [01-1] orientation, and a third type of sides along [010] orientation. The base layer is formed on a second region of the substrate, which is substantially same with the first region.

These HBT suppress the increasing of the collector resistance due to a shrinking of their size. The HBT according to the present invention may have InP for the substrate, the collector layer and the emitter layer, while InGaAs for the base layer.

Another aspect of the present invention relates to a method for producing the HBT. The method comprises: a) sequentially growing a first semiconductor film for the collector layer, a second semiconductor film for the base layer and a third semiconductor film for the emitter layer on the semiconductor substrate; b) processing the third film to the emitter layer and the second film to the base layer by using a first mask; c) forming a second mask on the first semiconductor film so as to cover the base layer and the emitter layer; and d) processing the first semiconductor film to the collector layer by using the second mask. The second mask is demarcated by a first type of edges extending along [011] orientation, a second type of edges along [01-1] orientation and a third type of edges along a predetermined orientation that crosses one of the first type of edges and the second type of edges.

Since the third film and the second film are processed with the first mask and the first film is processed with the second mask, a shape of the second mask may be so formed that the plan shape of the collector layer corresponds to that of the base layer.

In the method, the predetermined axis may extend along [010] direction, or may extend along the direction not across one of the first type of edges and the second type of edges.

Further in the method according to the present invention, preceding to the processing of the third film to the emitter layer and the second film to the base layer, the first mask is formed on the third semiconductor film. The first mask comprises a plurality of edges extending along directions different to [010] orientation.

In the present method, the first film for the collector layer may be made of InP and processed by a solution including hydrochloric acid.

BRIEF DESCRIPTION OF DRAWINGS

From FIG. 1A to FIG. 1C are cross sectional views illustrating the process for the HBT of the present invention.

Figure 3A:
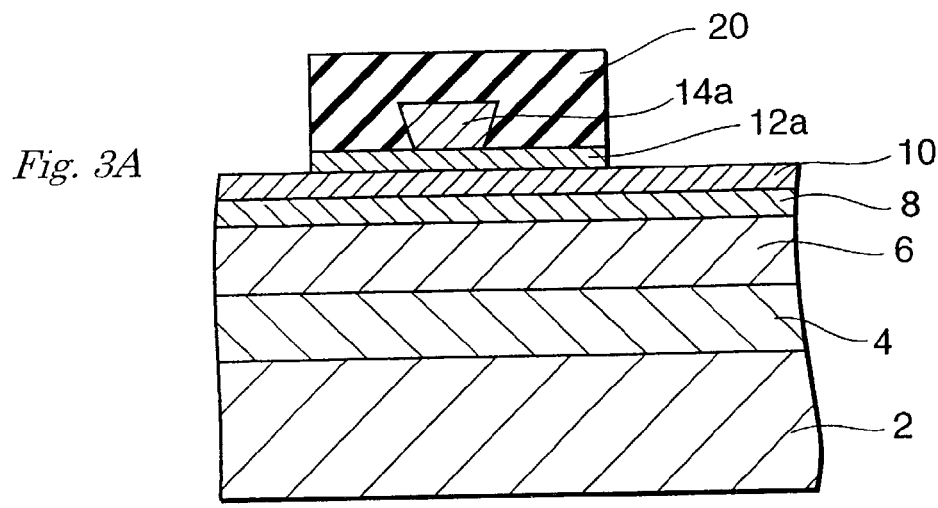
Figure 3B:
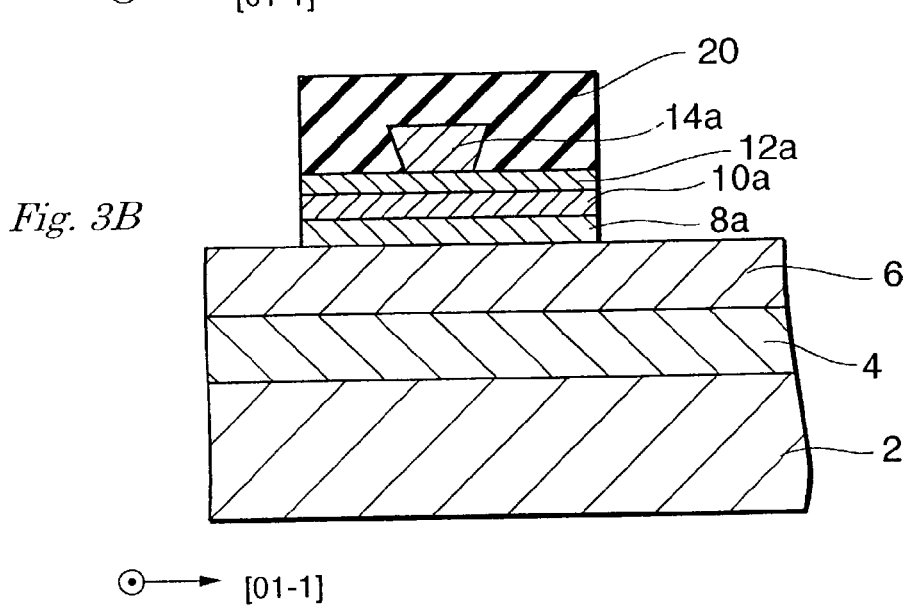
Figure 3C:
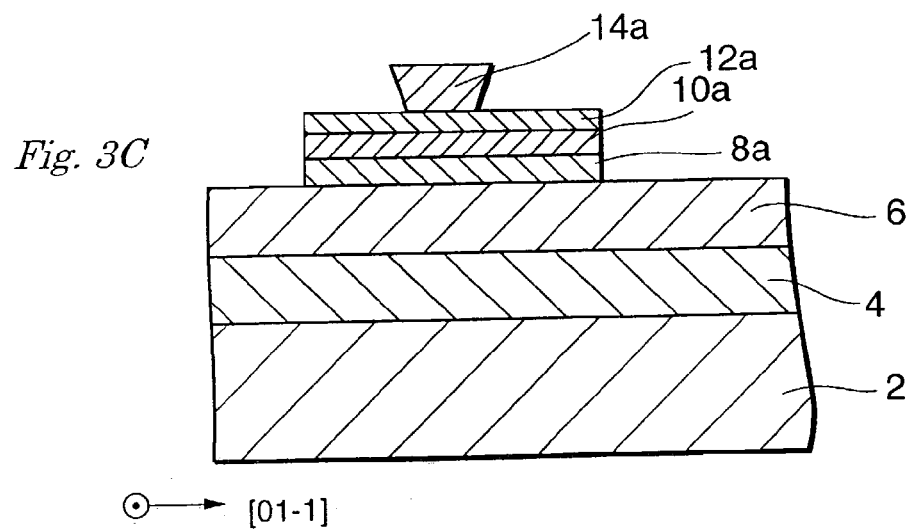
Figure 4:
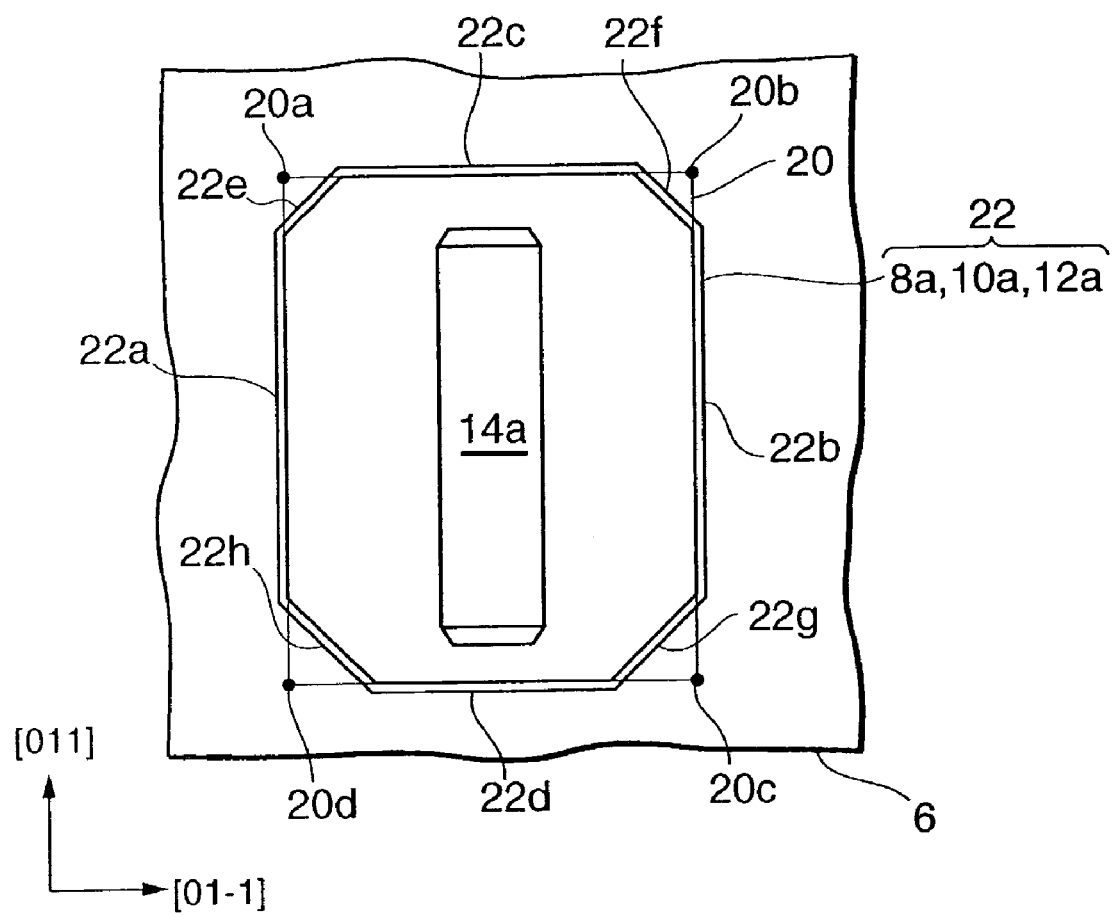
Figure 5A:
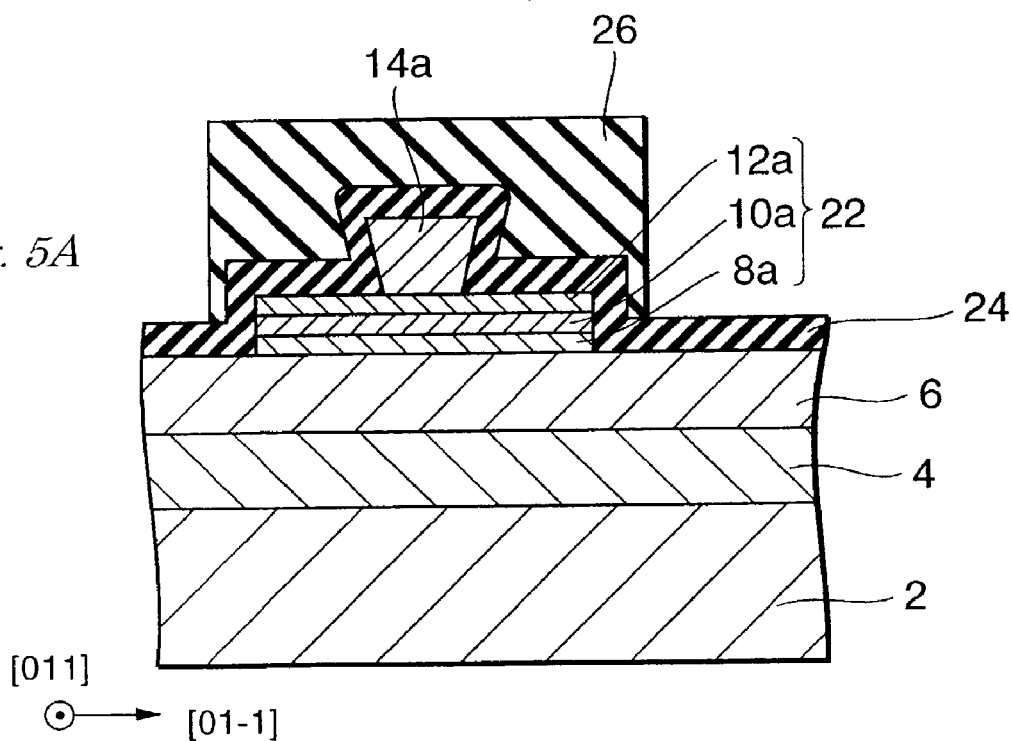
Figure 5B:
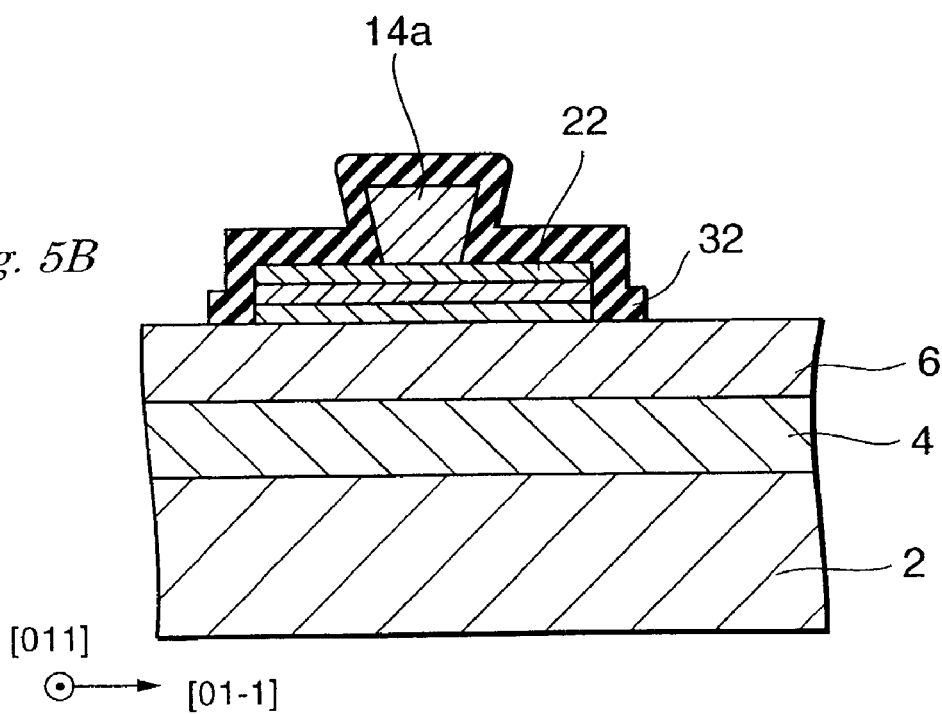
Figure 6A:
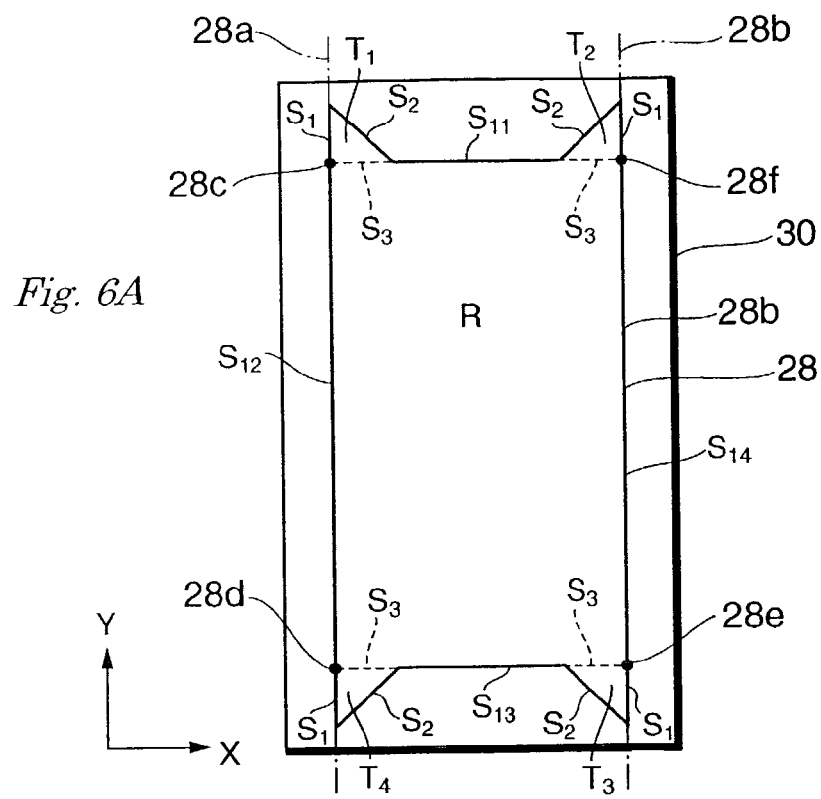
Figure 6B:
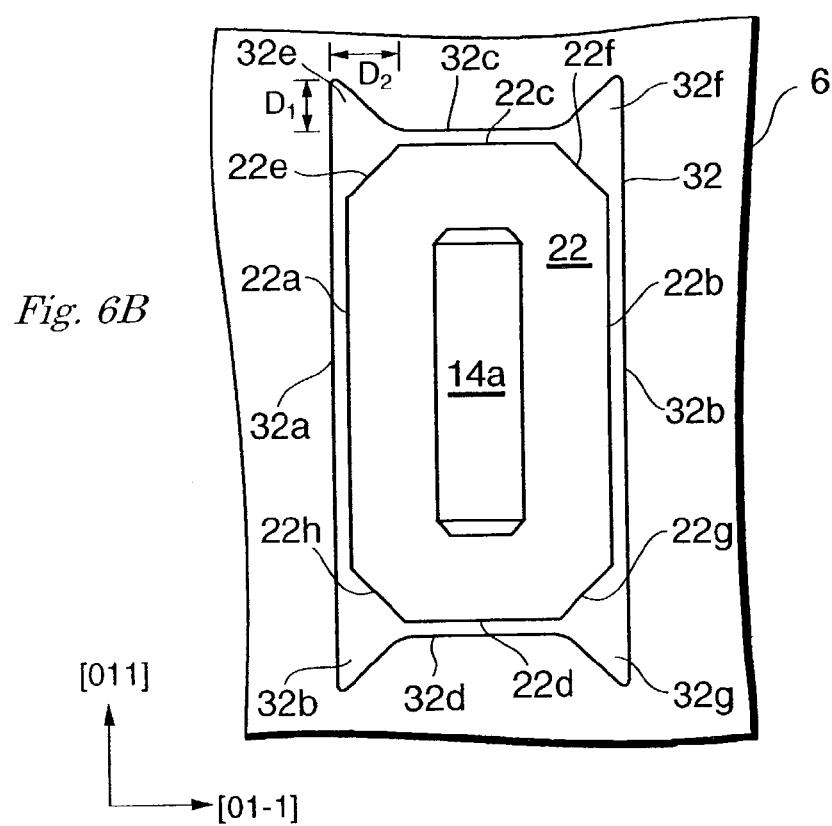
Figure 8A:
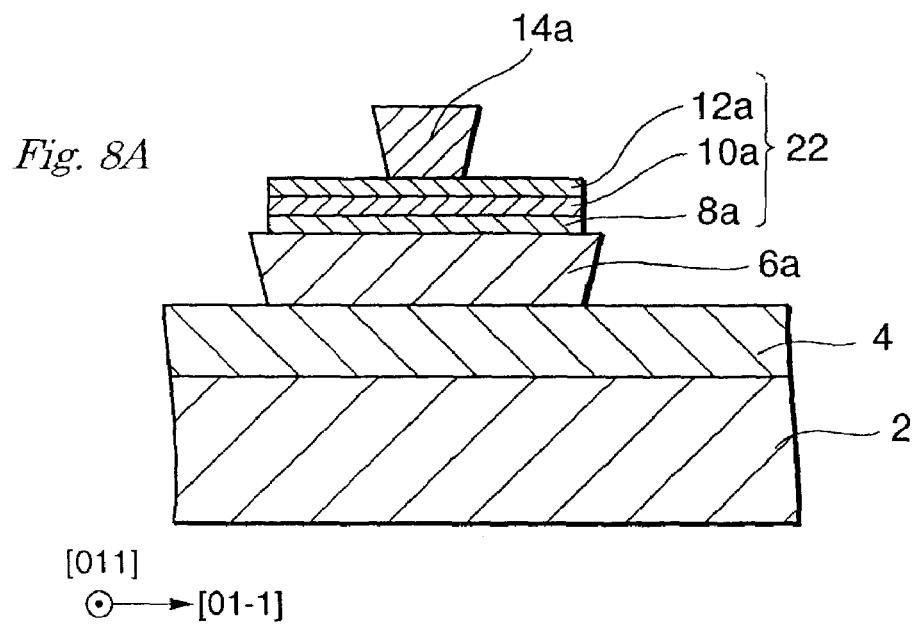
Figure 8B:
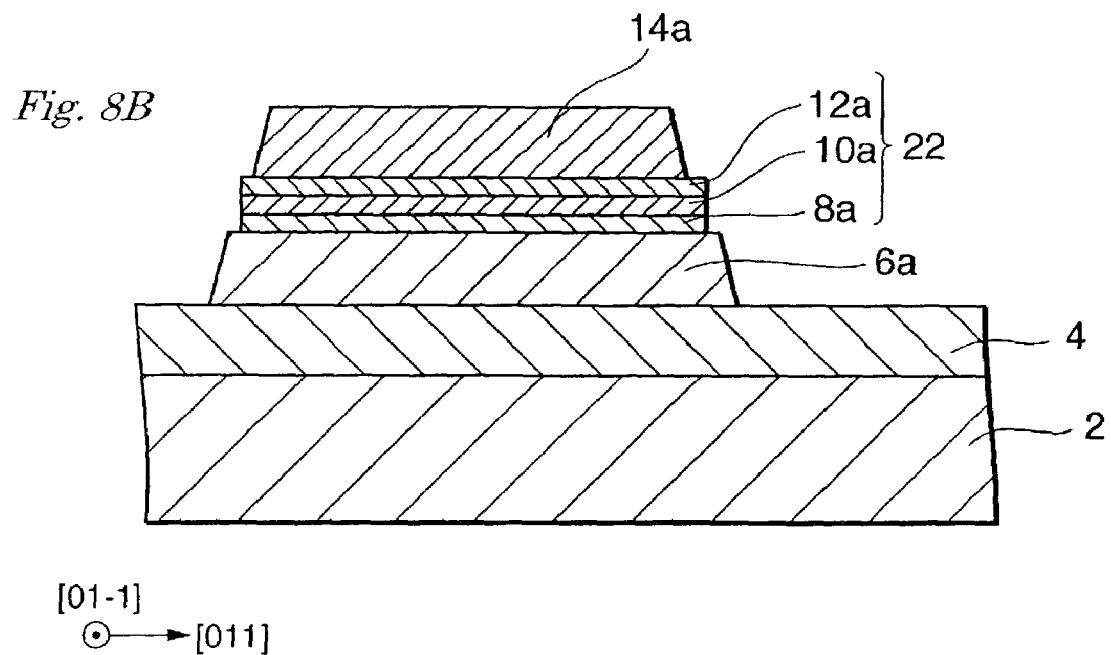

From FIG. 3A to FIG. 3C show the emitter-base mesa;

FIG. 4 is a plan view showing the emitter-base mesa;

From FIG. 5A to FIG. 5B are sectional views showing the formation of the etching mask for the collector layer;

FIG. 6A is a plan view showing the etching mask for the collector layer, and FIG. 6B shows the formation of the collector mesa;

From FIG. 7A to FIG. 7C illustrate the appearance of the collector layer as the etching proceeds;

FIG. 8A and FIG. 8B are cross sectional view showing the collector layer.

Figure 9A:
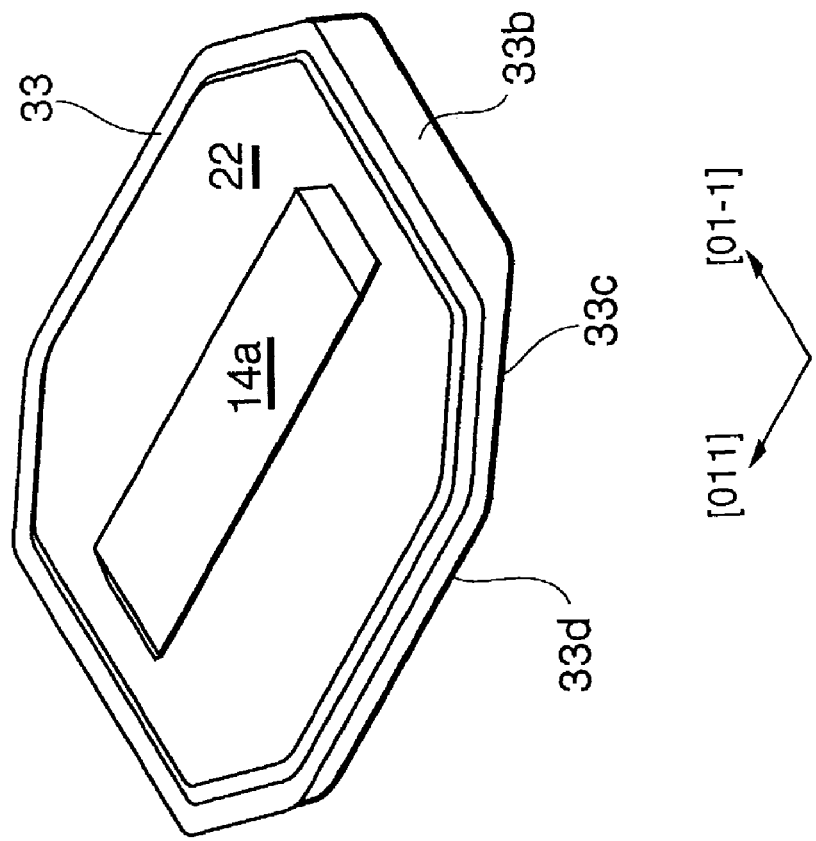
Figure 9B:
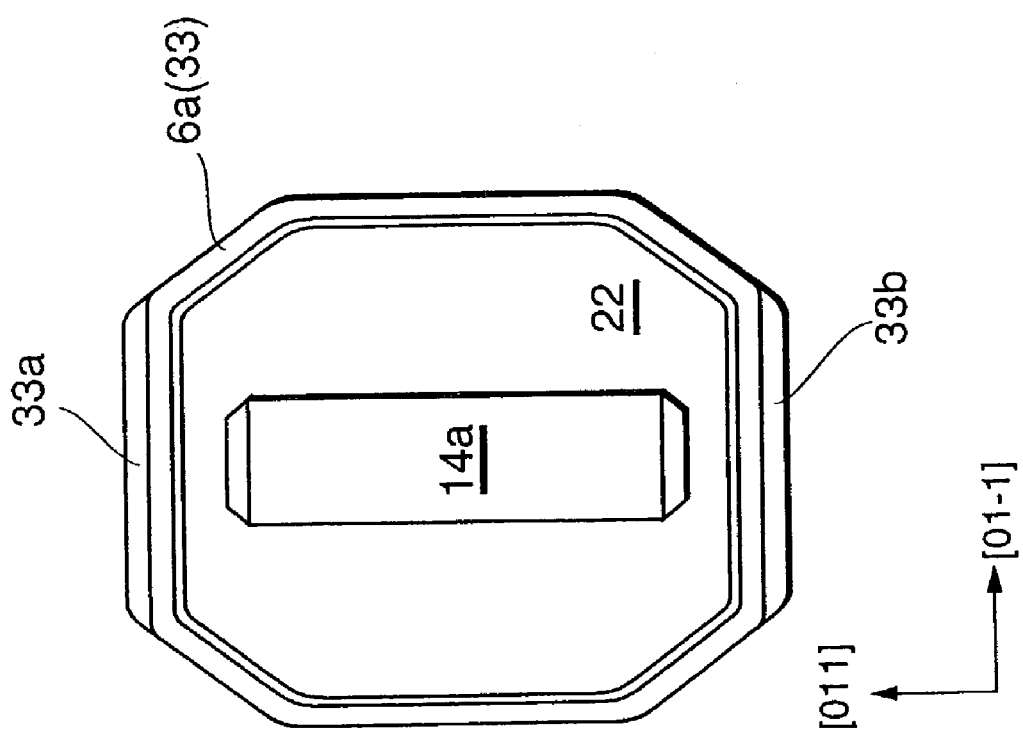
Figure 11A:
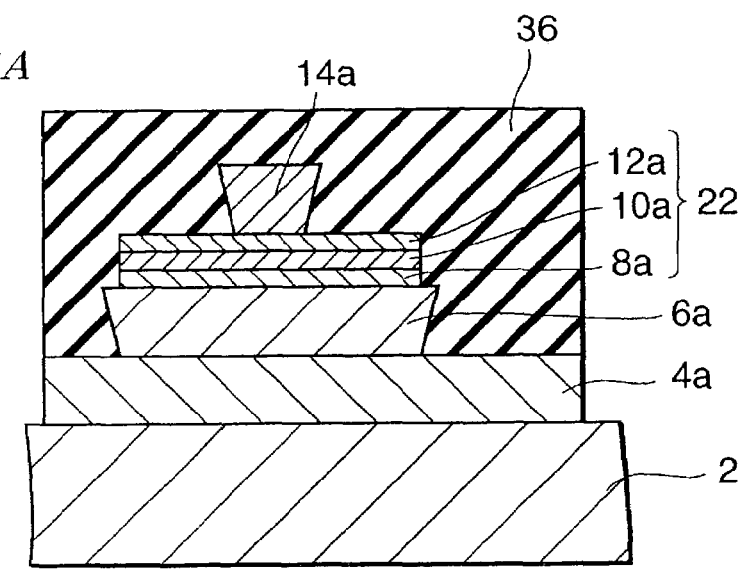
Figure 11B:
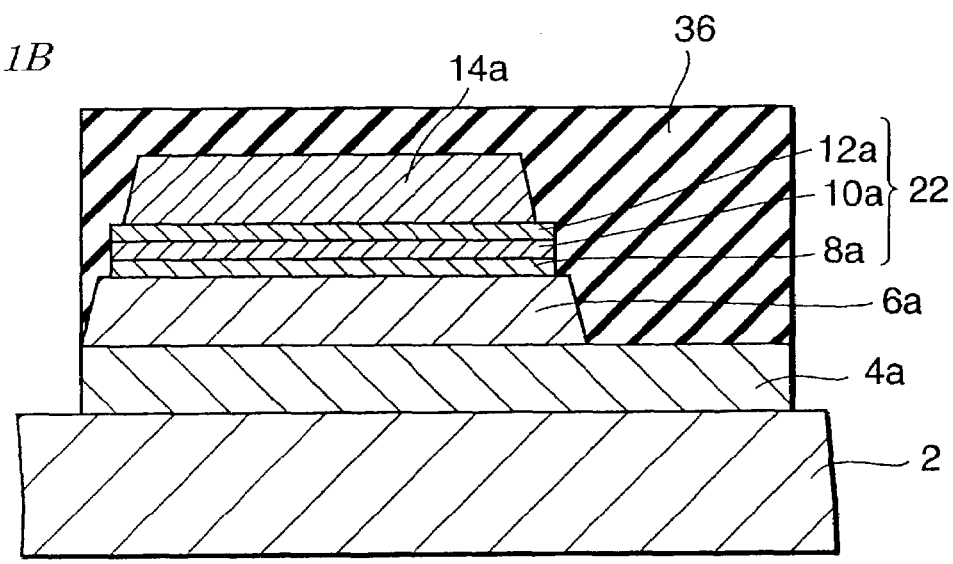
Figure 12A:
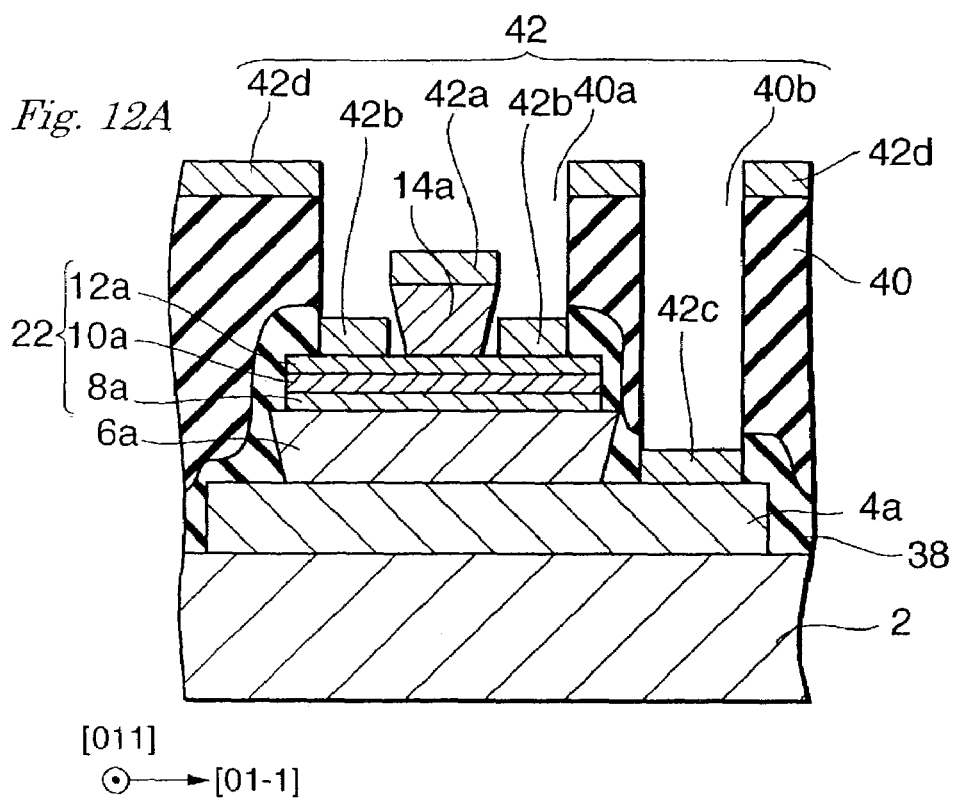
Figure 12B:
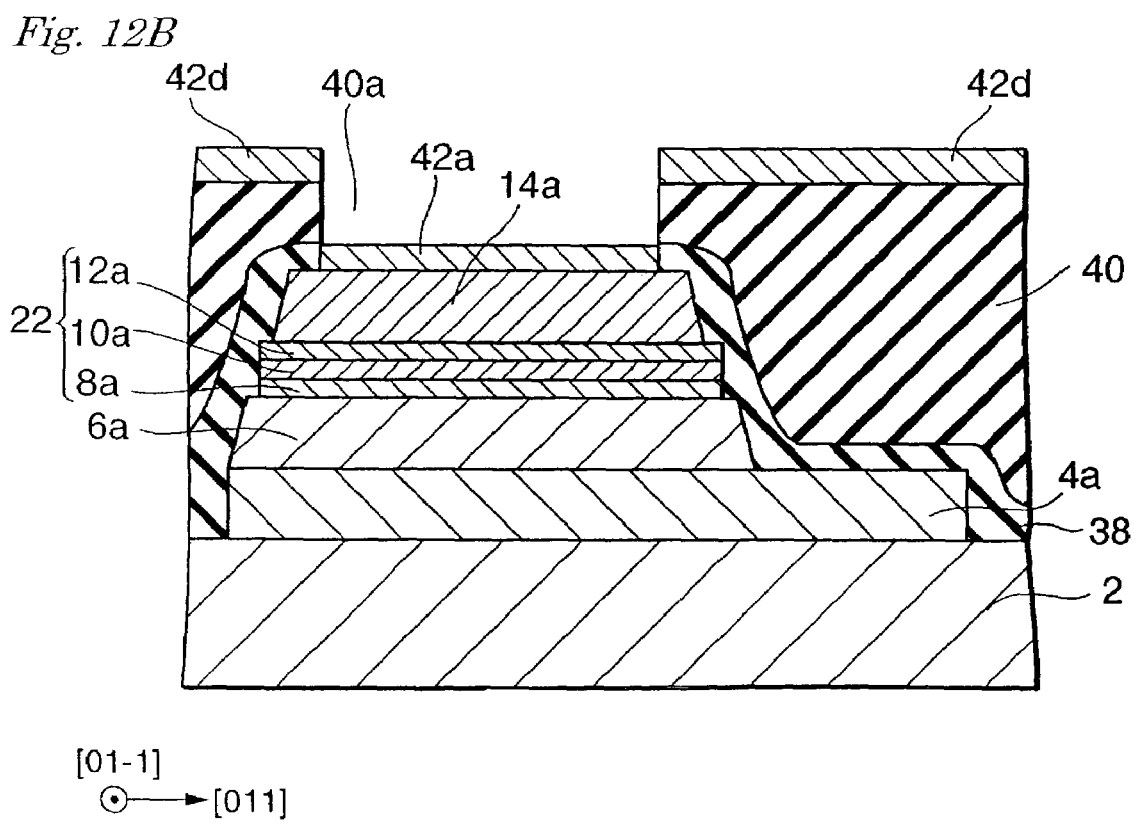
Figure 13:
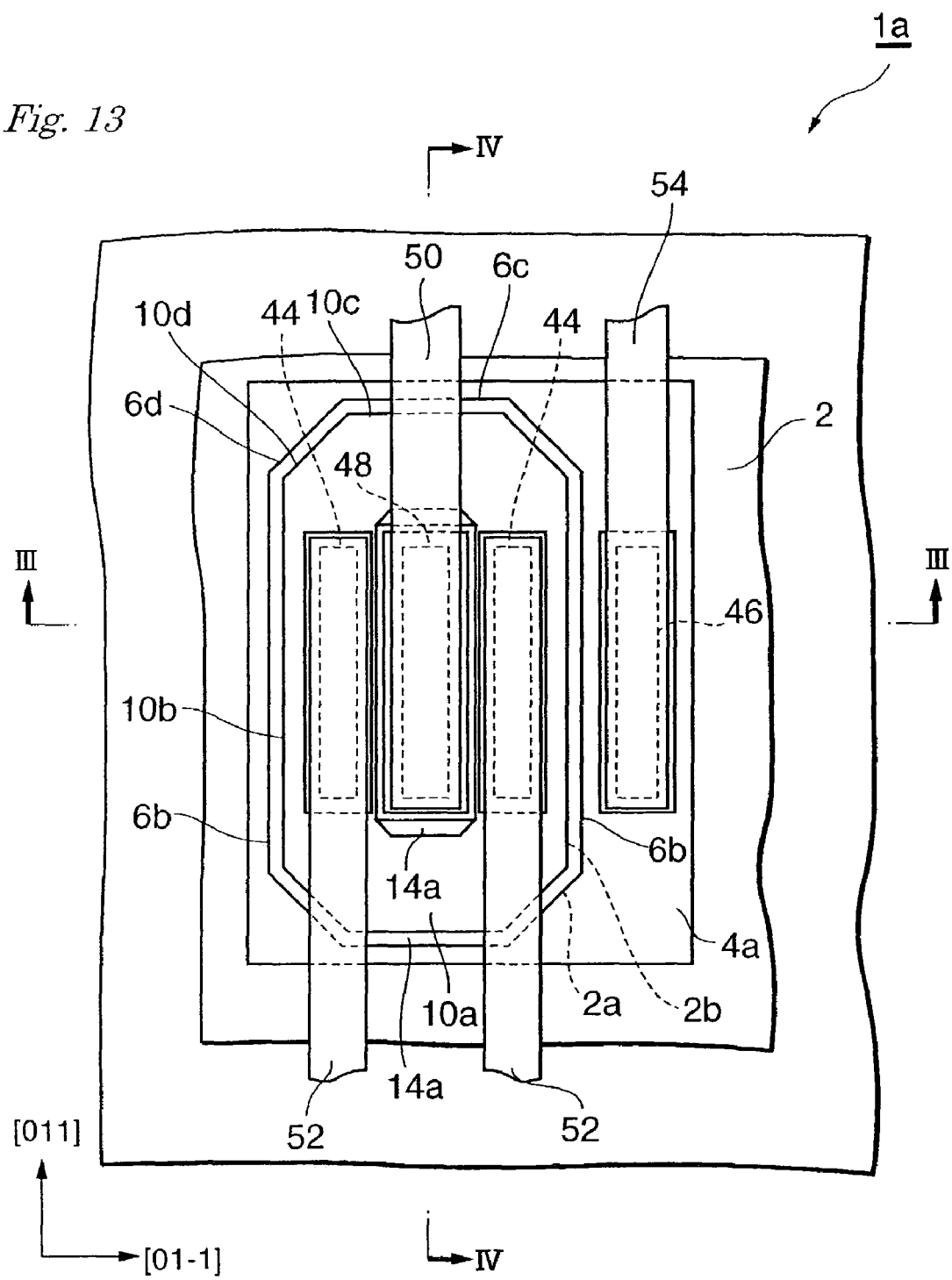
Figure 14A:
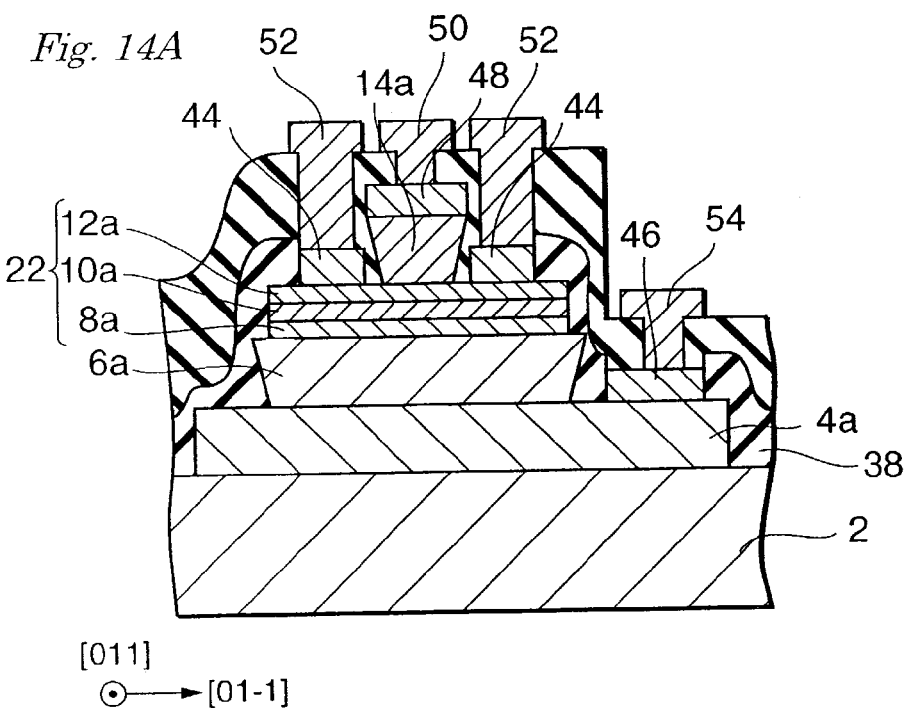
Figure 14B:
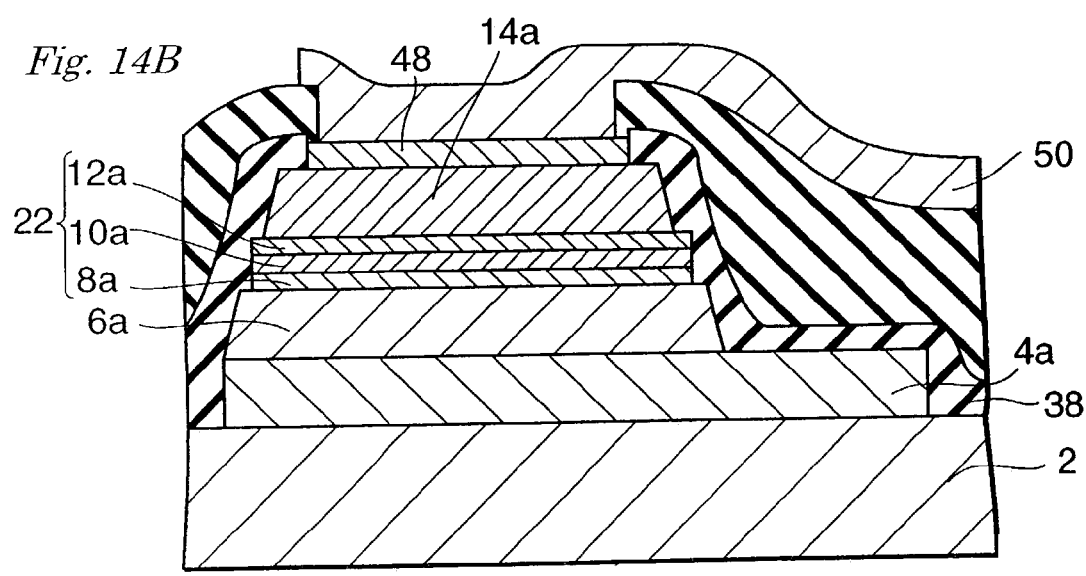

FIG. 9A illustrates the plan view of the collector layer after the etching, and FIG. 9B is a perspective view of the collector layer;

FIG. 10A and FIG. 10B are plan view and a perspective view processed by the conventional etching mask without any projective portions;

FIG. 11A and FIG. 11B are cross sectional views showing the sub-collector layer;

FIG. 12A and FIG. 12B show the process for forming the electrode of the collector, the base and the emitter;

FIG. 13 is a plan view of the transistor with wiring;

FIG. 14A is a cross sectional view taken along the line III—III in FIG. 13, and FIG. 14B is a cross sectional view along the line IV—IV in FIG. 13;

From FIG. 15A to FIG. 15D show modified patterns of the photo-mask used for the first embodiment; and From FIG. 16A to FIG. 16D are another modified patterns of the photo-mask for the first embodiment.

DETAILE DESCRIPTION OF THE INVENTION

Next, preferable embodiments for a manufacturing method of a hetero-junction bipolar transistor according to the present invention will be described as referring to accompanying drawings. In drawings, Elements identical to each other will be referred to with numerals identical to each other without overlapping explanations.

First Embodiment

Figure 1A:
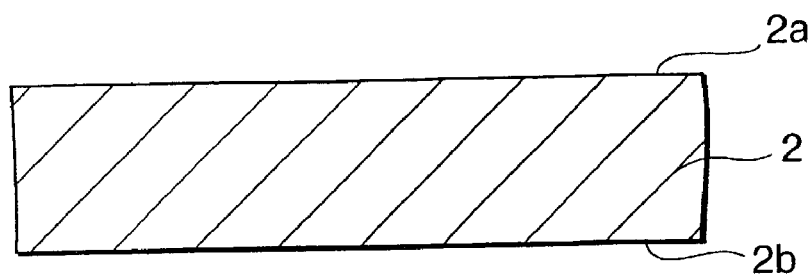
Figure 1B:
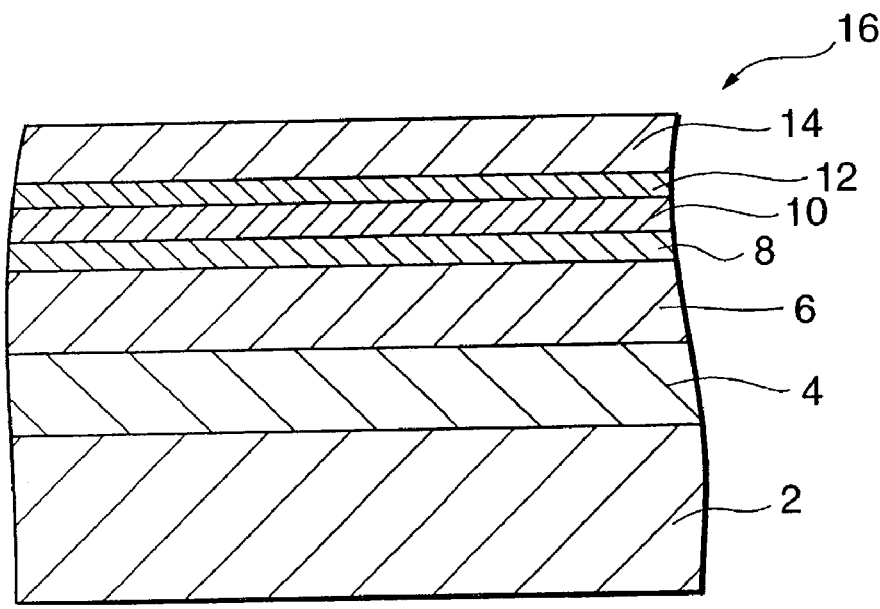
Figure 1C:
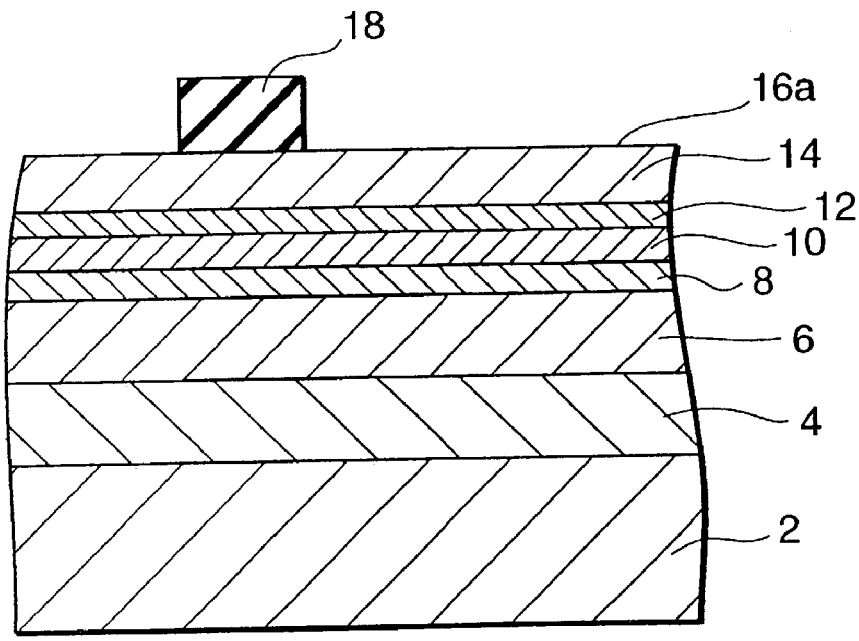

Figures from FIG. 1A to FIG. 1C show cross sectional views of a double-hetero-junction bipolar transistor (hereinafter denoted by DHBT) at manufacturing steps. As shown in FIG. 1A, a semi-insulating InP substrate 2 is prepared. The substrate has a primary surface 2a with a (100) crystal surface.

(Crystal Growth)

FIG. 1B shows semiconductor layers grown on the substrate 2. A series of semiconductor films of a sub-collector film 4, a collector film 6, a graded-collector film 8, a base film 10, an emitter film 12, and an emitter-contact film 14, are sequentially grown on the substrate. An organo-metallic vapor phase epitaxy (OMVPE) technique performs the growth of these films. Triethyl Gallium (TEGa), Trimethyl Indium (TMIn), Arsine ($AsH_3$) and Phosphine ($PH_3$) are used for source materials of the OMVPE. Compositions, dopant materials, thickness and carrier concentrations of respective films are shown in the following table. Composition of ternary material (InGaAs) and that of quo-ternary material (InGaAlAs) are selected so that a lattice constant thereof matches to that of InP within ±0.1%.

TABLE 1

| Film | Material | Dopant | Thickness (nm) | Carrier Concentration ($cm^{-3}$) |
|---|---|---|---|---|
| sub-collector film 4 | InGaAs | Si | 300 | $2 \times 10^{19}$ |
| collector film 6 | InP | — | 330 | −z |
| graded-collector film 8 | InGaAlAs | Si | 50 | $1 \times 10^{17}$ |
| base film 10 | InGaAs | C | 50 | $4 \times 10^{19}$ |
| emitter film 12 | InP | Si | 10 | $4 \times 10^{18}$ |
| emitter-contact film 14 | InGaAs | Si | 250 | $4 \times 10^{19}$ |

The sub-collector film 4, the graded-contact film 8, the emitter film 12 and the emitter-contact film 12 are n-type semiconductor containing Si with a dopant material. Doping source for the n-type dopant is Silane (SiH4) is used. By increasing the carrier concentration of the emitter-contact film 14, a good ohmic contact between the emitter-contact film 14 and an emitter electrode may be obtained.

On the other hand, carbon (C) atoms may be used in the base film 10 as a p-type dopant. Doping source is Carbon-bromide ($CBr_4$). By using carbon as the p-type dopant, the hole concentration in the base film 10 can be increased, which improves the high-frequency performance of the DHBT. Diethyl Zinc (DEZn) may be substitutable for $CBr_4$.

(First Mesa Formation)

FIG. 1C shows a formation of the first mesa. The first mesa involves an emitter contact layer. An etching mask 18 made of an inorganic material, such as SiN, is formed on the emitter contact film 14 by a photolithography technique. Dipping the substrate into an etchant including a phosphoric acid and a hydrogen peroxide, a disposed portion from the etching mask 18 of the emitter contact film 14 is removed. Since the above etchant etches the InGaAs film of the emitter contact 14 selectively to the emitter film made of InP, only the emitter contact film 14 may be removed. An emitter contact layer 14a thus processed is formed on the emitter film 12 as shown in figures from FIG. 2A to FIG. 2C.

Figure 2A:
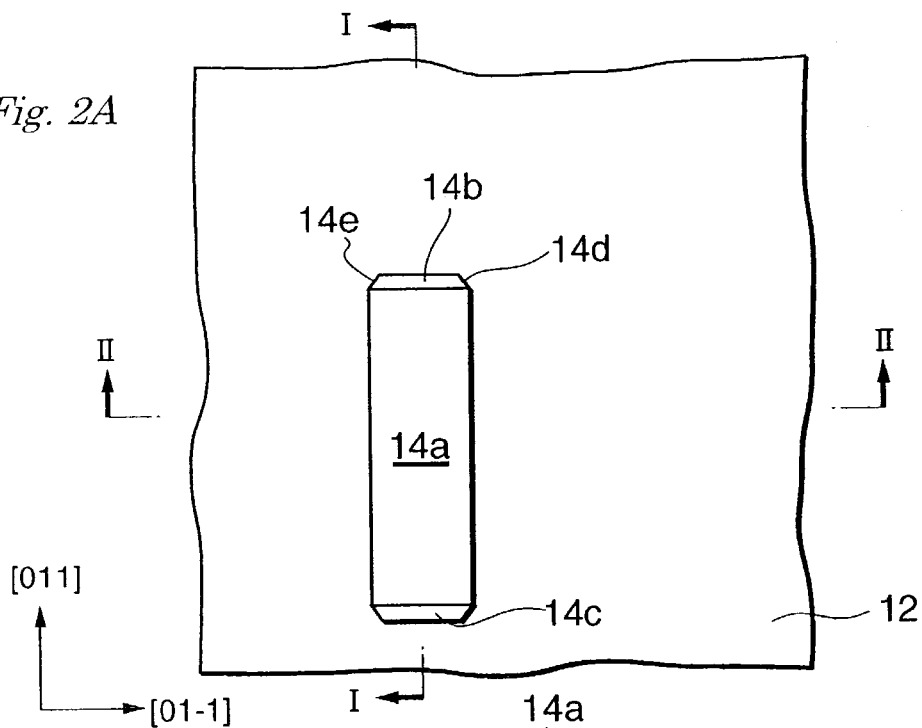
FIG. 2A is a plan of the emitter-contact mesa.
Figure 2B:
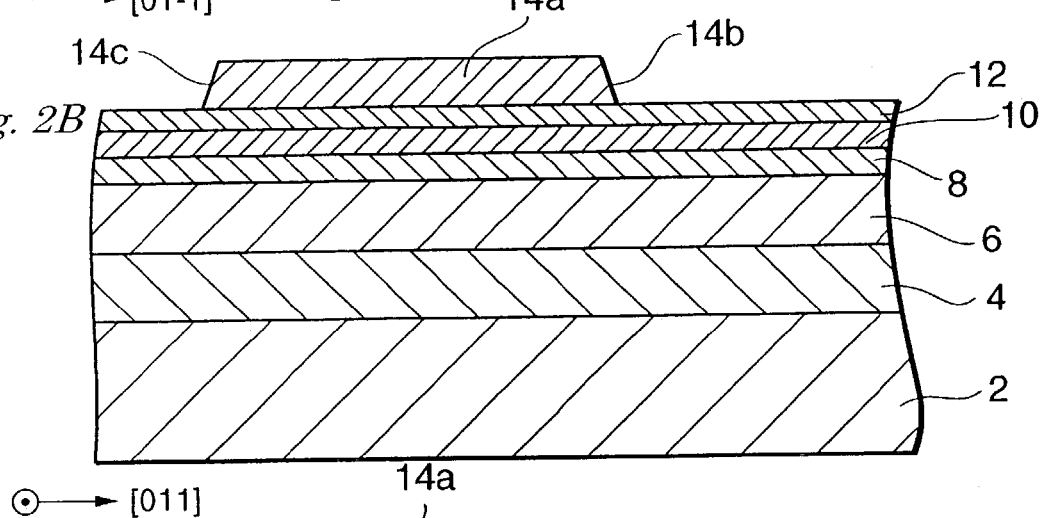
FIG. 2B is a cross sectional view taken along the line I—I in FIG. 2A.
Figure 2C:
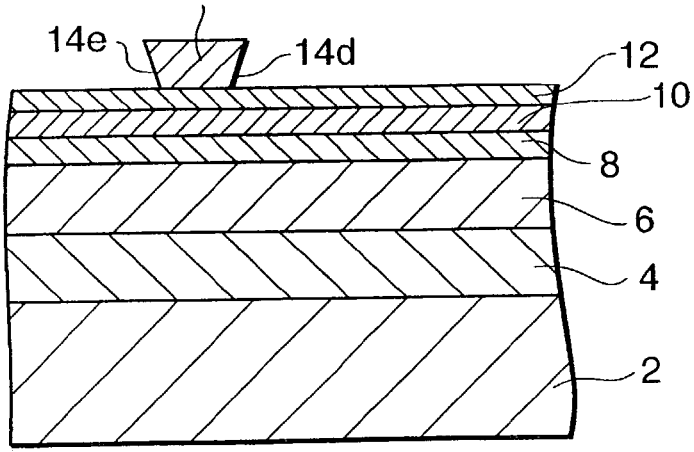
FIG. 2C is a cross sectional view taken along the line II—II.

FIG. 2A is a plan view showing the emitter-contact layer 14a formed by the process above described. FIG. 2B is a cross sectional view taken along the line I—I in FIG. 2A, and FIG. 2C is another cross sectional view taken along the ling II—II in FIG. 2A. The emitter-contact layer 14a has a pair of side surfaces 14b and 14c extending along [01-1] crystal orientation, and a pair of side surfaces 14d and 14e extending along [011] crystal orientation. In the present embodiment, the plan shape of the emitter-contact layer 14a is a nearly rectangle and formed on the emitter film 12.

(Second Mesa Formation)

Figures from FIG. 3A to FIG. 3C illustrate the manufacturing step of the second mesa formation. The second mesa includes an emitter layer 12a, a base layer 10a and a graded-collector layer 8a. Referring to FIG. 3A, an etching mask 20, which may be made of an inorganic material such as SiN and processed by the photolithography technique, is formed on the base film 12. The mask 20 is formed on the emitter film so as to cover the emitter-contact layer 14a.

By using a hydrochloric acid as an etchant, a portion of the emitter film 12 not covered by the mask 20 is etched selectively to the base film 10 made of InGaAs. Namely, the etching rate of this etchant for InGaAs is quite small as compared to that for InP. This etching process forms an emitter layer 12a as shown in FIG. 3A.

Subsequently to the forming the emitter layer 12a, another etchant of a mixture of phosphoric acid and hydrogen peroxide etches the base film 10 and the graded-collector film 8. Contrary to the first etchant of the hydrochloric acid, the second etchant shows an etching selectivity of the InGaAs or InGaAlAs to InP, namely the etching rate of the second etchant for InP is quite small compared to that for InGaAs or InGaAlAs. This second etching of the base film 10 and the graded-collector film 8 forms a base laser 10a and a graded-collector layer 8a on the collector film 6, as shown in FIG. 3C.

FIG. 4 is a plan view showing the emitter-base mesa 22 formed by the etching process above described with the etching mask 20 is removed. The emitter-base mesa 22 comprises the emitter layer 12a, the base layer 10a and the graded-collector layer 8a. The plan shape of the etching mask 20 is nearly rectangle with four corners from 20a to 20d, a pair of edges extending along [011] crystal orientation and a pair of edges extending along [01-1] crystal orientation. While undercuts are formed at respective corners of the mask 20 and the plan shape of the emitter-base mesa is substantially octagonal. Consequently, the emitter-base mesa has a first pair of side edges 22a and 22b extending along [011] crystal orientation, a second pair of side edges 22c and 22d along [01-1] crystal orientation, and four side edges from 22e to 22h extending along [010] crystal orientation and its equivalent. The plurality of side edges 22e to 22h respectively connects to the corresponding side edges. For example, the side edge 22e connects the first side edge 22a to the second side edge 22c.

(Etching Mask Formation)

From FIG. 5A to FIG. 6B show process steps of forming an etching mask for the collector film. Referring to FIG. 5A, an inorganic film 24, such as SiN, is formed so as to cover the collector film 6, the emitter-base mesa 22 and the emitter contact layer 14a. A photo-resist 26 is formed on the inorganic film 24 and processed in photolithography to a specific plan shape by a photo mask 30 shown in FIG. 6A. The inorganic film 24 is dry-etched by using the etching mask 26. After removing the photo-resist 26, the inorganic film 24 with the specific plan shape can be obtained.

FIG. 6A is a plan view showing a photo-mask pattern 28 for the etching of the collector film 6. The photo-mask pattern 28 comprises a region R (hereinafter denoted as the first region) and a plurality of subsidiary regions from $T_1$ to $T_4$ (hereinafter denoted by the second regions). The first region R reflects a collector layer to be formed and has a pair of sides $S_{11}$ and $S_{13}$ extending along [01-1] crystal orientation, and another pair of sides $S_{12}$ and $S_{14}$ extending along [011] orientation. The second regions from $T_1$ to $T_4$ are triangles formed by sides $S_1$ and $S_2$, which forms an acute angle to each other, and another side $S_3$ is denoted by broken lines. The second regions $T_1$ to $T_4$ are in contact with the first region R. Namely, as shown in FIG. 6A, the side $S_3$ of the region $T_1$ is in contacts with the side $S_{11}$ of the first region and falls on a line 28a, on which the side $S_{12}$ of the first region R falls, too. Similarly, the side $S_3$ of the second region $T_4$ is in contact with the side $S_{13}$ of the first region and the side $S_1$ falls on a line 28a. The side $S_{12}$ of the first region R comprises a line combined with the side $S_1$ of the region $T_1$ and the side $S_1$ of the region $T_4$. The side $S_3$ of one of the second region $T_2$ is in contact with the $S_{11}$ of the first region R and the side $S_1$ of the second region $T_2$ falls on a line 28b. The side $S_{14}$ of the first region comprises a line combined with the side $S_1$ of the second region $T_2$ and the side $S_1$ of the second region $T_3$. As shown in FIG. 6A, the second regions from $T_1$ to $T_4$ are respectively located so that points intersecting lines S1 and S3 are aligned to corresponding points from 28c to 28f of the first region R.

Referring back to FIG. 5B, a cross sectional view after the etching of the inorganic film 24 by using the photo-resist 26 is illustrated. The inorganic film 24 is processed to an etching mask 32. FIG. 6B is a plan view showing the processed inorganic film 32, the emitter-base mesa 22 and the emitter contact layer 14a. The processed inorganic film 32 covers not only the emitter contact layer 14a but also the emitter-base mesa 22, thereby protects the emitter-base mesa 22 from being etched at the subsequent process. The shape of the processed inorganic film 32 approximately reflects the photo-mask pattern, but the corners thereof are blunted due to lack of the resolution.

The processed inorganic film 32 has edges from 32a to 32d each extending along corresponding edges 22a to 22d of the emitter-base mesa. Further, the film 32 has two portions 32e and 32f each projected from the side 32c and another two portions 32g and 32h each projected from the side 32d. These projected portions from 32e to 32h are aligned to edges from 22e to 22h of the emitter-base mesa extending along [010] crystal orientation. Typical dimensions $D_1$ and $D_2$ of the projection are about 0.3 µm.

(Third Mesa Formation)

After processing the inorganic film 32, the substrate 2 is immersed in a solution of hydrochloric acid. The portion not covered by the inorganic film 32 of the collector film 6 is removed. This etchant etches the collector film made of InP selectively to the sub-collector film made of InGaAs. Therefore, the etching substantial stops after the surface of the sub-collector film is exposed.

From FIG. 7A to FIG. 7C are views showing SEM photographs taken as the etching of the collector film is performed. FIG. 7A shows an appearance of the collector film 61 after the etching of 80 seconds, in which edges of the collector film 61 under the corresponding corners from 32e to 32h of the inorganic film 32 are selectively removed. FIG. 7B shows an appearance after the etching of 120 seconds, in which edges under the respective corners of the film 32 are removed further. This peculiar etching behavior reflects the intrinsic characteristic of the semiconductor material with a zinc-blend crystal structure, in which the etching rate along [001] crystal orientation is larger than that along [011] crystal orientation. FIG. 7C shows an appearance after the etching of 160 seconds, in which the plan shape of the collector film 63 is nearly same as that of the emitter-base mesa 22.

Comparing the appearance of the collector film 63 in FIG. 7C to that shown in FIG. 7A, side edges extending along [011] crystal orientation are little etched. This inhomogeneous etching characteristic shows that, when the dimension of the projected regions from $T_1$ to $T_4$ of the photo-mask 28 are defined depending on the thickness of the collector film 6, the position of the edges of the collector layer 63 can be adjusted to that of the emitter-base mesa 22. In the etching of the collector film 6, since the processed inorganic film 32 covers the side surface of the emitter-base mesa 22, layers from 8a to 12a within the emitter-base mesa are not affected by the etching. In FIG. 8A and FIG. 8B, cross sectional views at the etching of the collector film 6 are shown. By the etching above described, the collector film is converted to the collector layer 6a, which is the collector mesa 33.

FIG. 9A is a plan view showing the collector mesa 33 after the etching and FIG. 9B is a perspective view of the collector mesa 33. As shown in figures, side surfaces 33a and 33b, which extends along [01-1] crystal orientation, of the collector mesa 33 has a normal mesa surface, where (111) surface is appeared. On the other hand, the edge 33d extending along [011] crystal orientation has a reverse mesa surface 33d, where (1-1-1) surface is appeared, and anther edge 33c extending along [001] exposes (001) surface.

FIG. 10A and FIG. 10B show the shape of the collector mesa 34 when the etching of the collector film 6 to form the collector mesa is performed by using an etching mask without projected regions. The collector layer 34a in FIG. 10A and FIG. 10b is considerably side-etched under the emitter-base mesa 34b. Comparing the shape of the collector mesa in FIG. 10A to that in FIG. 9A, the side edge of the collector layer 34a extending along [001] crystal orientation is far from the side edge of the emitter-base mesa along [001] orientation and is close to the side edge of the emitter contact mesa 34c. Therefore, when the size of the transistor is shrunk, the collector resistance may increase due to the shape of the collector layer.

(Sub-Collector Mesa Formation)

FIG. 11A and FIG. 11B are cross sectional views showing a process for forminig the sub-collector mesa. First, an etching mask 36 is formed so as to cover the collector layer 6a, the emitter-base mesa 22 and the emitter-contact layer 14a. In this embodiment, the mask 36 is made of a photo-resist.

After forming the mask 36, the substrate is immersed to a mixture of phosphoric acid and hydrogen peroxide. This etchant etches InGaAs selectively to InP; namely, the etching rate for InP is far small compared to that for InGaAs. Therefore, after exposing the InP substrate, the etching substantial stops. By this etching, the sub-collector film 4 is converted to the sub-collector layer 4a. Another etchant, such as a mixture of sulfuric acid and hydrogen peroxide, may be used instead of the mixture of phosphoric acid and hydrogen peroxide. The sub-collector layer 4a electrically isolates the transistor thus formed from transistors formed adjacently on the substrate.

(Electrode Formation)

Next, the process for forming electrodes of the collector, the base and the emitter will be described. Referring to FIG. 12A and FIG. 12B, an inorganic film 38 such as SiN is formed to cover the sub-collector layer 4a, the base layer 12a and the emitter contact layer 14. A photo-resist 40 with an etching pattern is formed on the inorganic film 38. The etching pattern has openings 40a and 40b on the sub-collector layer 4a, the base layer 12a and the emitter contact layer 14a. The opening 40a is for the emitter electrode and the base electrode while the opening 40b is for the collector electrode.

After forming the photo-resist 40, a series of metals of titanium (Ti), platinum (Pt) and gold (Au) are sequentially stacked on the photo-resist and within the openings 40a and 40b. In the opening 40a, since the emitter contact layer has side edges of the reverse mesa extending along [011] crystal orientation, metals are not deposited on the emitter layer 12a under the overhang of the emitter contact mesa 14a. Therefore, the emitter electrode 52a on the emitter contact layer 14a and the base electrode 42b on the emitter layer 12a are separated in self-alignment.

Metals 42d on the photo-resist 40 are removed at the same time of the dissolution of the photo-resist 40, which is called the lift-off method. Thus, the electrodes of the emitter, the base and the collector are formed. Subsequently to the electrode formation, an inorganic film 56 such as SiN is deposited on the substrate to passivate respective electrodes. In the passivation film 56, several via-holes are processed to contact electrically to respective electrodes, and on the film 56, wiring from the via-hole is deposited. FIG. 13 is a plan view of the transistor thus processed and FIG. 14A and FIG. 14B are cross sectional views taken along the line III—III and the line IV—IV in FIG. 13, respectively.

In FIG. 13, the transistor 1a comprises the semiconductor substrate 2a, the sub-collector layer 4a, the collector layer 6a, the graded-collector layer 8a, the base layer 10a, the emitter layer 12a and the emitter-contact layer 14a. Exemplary configuration is that the band gap energy of the sub-collector layer 4a is smaller than that of the collector layer 6a, the band gap energy of the base layer 10a is smaller than that of the emitter layer 12a and also the collector layer 6a, and the band gap energy of the emitter-contact layer 14a is smaller than that of the emitter layer 12a. The transistor 1a has the base electrode 44, the collector electrode 46 and the emitter electrode 48. The transistor further has the emitter wiring 50, the base wiring 52 and the collector wiring 54.

The substrate 2, the collector layer 6a and the emitter layer 12a may be made of InP, while the base layer 10a may be InGaAs. The collector layer 6a of the present transistor is demarcated by eight sides and the base layer 10a is also demarcated by eight sides, they corresponds to respective eight sides of the collector layer 6a and extends along the same direction as that of the collector 6a. The area of the collector layer 6a in this embodiment is substantially same as that of the base layer 10a. However, taking the fluctuation of the process condition into account, a ratio of the collector layer 6a to that of the base layer 10a may be greater than 0.9 and little than 1.1.

Another aspect of the present invention, the collector layer 6a of the transistor 1a is demarcated by the side 6b along [011] orientation, the side 6c along [01-1] orientation and the ling 6d along [010] orientation. The side 6d is shorter than the side 6b and the side 6c. On the other hand, the base layer 10a is demarcated by the side 10b along [011] orientation, the side 10c along [01-1] orientation, and the side 10d along [010] orientation. The side 10d is shorter than the side 10b and the side 10c.

Taking the fluctuation of the process condition into account, it is considered that the side 6d of the collector layer 6a may position in the inside of the side 10d of the base layer. When the collector film 6 is over-etched, the side 6d of the collector layer 6a is in the inside of the side 10d of the base layer 10a. The ratio of the side 10d of the base layer 10a to the side 6d of the collector layer 6a may be greater than 0.9 and smaller than 1.5. The transistors, in which the collector layer and the base layer has the relation above described, show a relative small collector resistance, thereby enhances performance of the transistor especially in high frequencies.

Second Embodiment

In the second embodiment, patterns of the photo-mask used in the etching of the collector film are described.

Figure 15A:
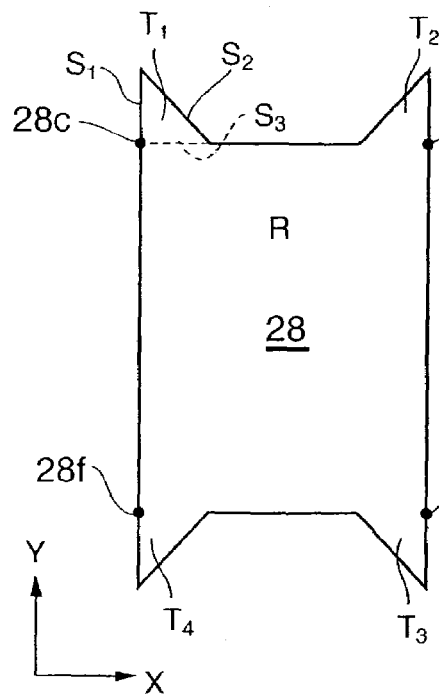

FIG. 15A shows the first pattern 28 of the photo mask used in the first embodiment. From FIG. 15B to FIG. 15D, various substitutional patterns are illustrated. By using these patterns, the prescribed shape described in the first embodiment can be obtained. In figures, first lines along the X-direction, second lines along the Y-direction and a plurality of lines crossing one of the first line and the second line define these patterns, where the X-direction and the Y-direction coincide with [011] crystal orientation and [01-1] crystal orientation, respectively.

Figure 15B:
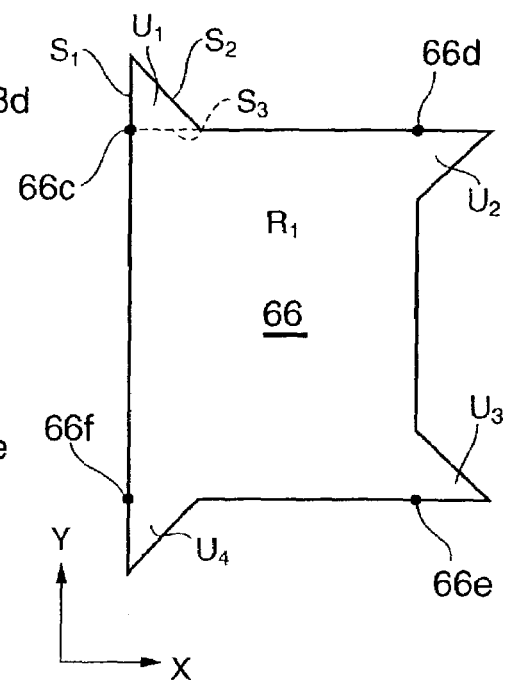
Figure 15C:
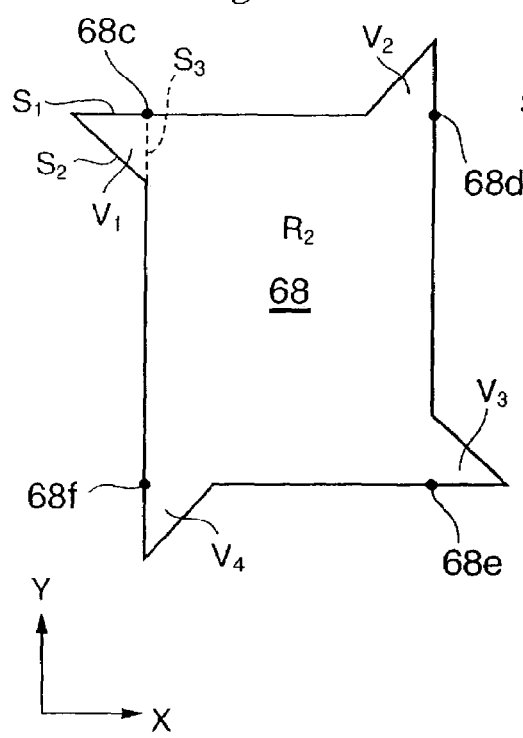
Figure 15D:
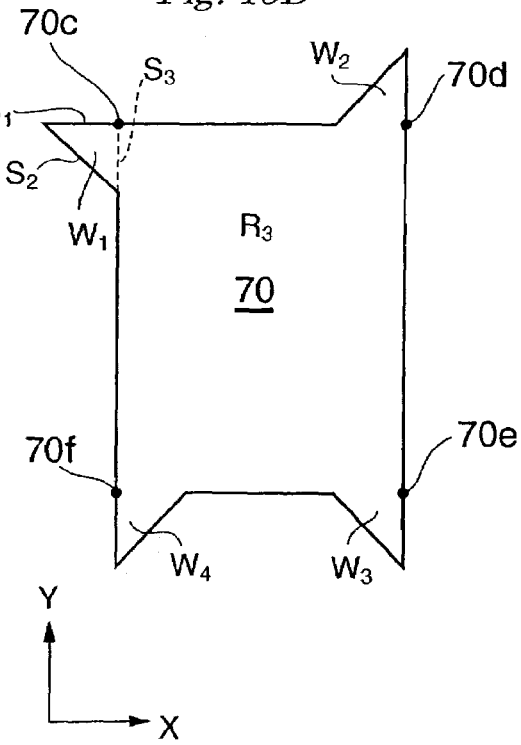

Referring to FIG. 15B, the pattern 66 comprises a first portion $R_1$ and a plurality of second portions from $U_1$ to $U_4$. The portion $R_1$ corresponds to the collector layer to be formed. Respective portions from $U_1$ to $U_4$ are aligned to corners from 66c to 66f of the first portion $R_1$. Similarly, the pattern 68 in FIG. 15C and the pattern 70 in FIG. 15D comprise the first portion $R_2$, $R_3$ and a plurality of second portions $V_1$ to $V_4$, W1 to $W_4$, respectively. Moreover, respective second portions locate at the corner, from 68c to 68f and from 70c to 70f, of the respective first portion.

The second portion, $U_1$ to $U_4$, $V_1$ to $V_4$ and $W_1$ to $W_4$ and have a substantially triangle shape, which comprise a pair of side S1 and S2 making an acute angle to each other and another side, which connects the side S1 to the side S2 and illustrated by a broken line in figures. Portions from $U_1$ to $U_4$ are in contact with the portion $R_1$, portions from $V_1$ to $V_4$ are in contact with the portion $R_2$, and portion $W_1$ to $W_4$ are in contact with the portion $R_3$. The respective second portion are shaped so as to form projected portions, 32e to 32h, in FIG. 7 and is aligned to side edges, 22e to 22h, extending along [010] orientation of the emitter-base mesa in FIG. 6.

Other modified patterns are illustrated in figures from FIG. 16A to FIG. 16D. These patterns also realize the expected shape of the collector layer. Namely not only the triangle but also substantially rectangle of the second portion may be applicable. Referring to FIG. 16A, the pattern 72 comprises a substantially rectangle portion $R_4$ and a plurality of rectangle portions from $X_1$ to $X_4$, which are called the first portion and second portions, respectively. The first portion $R_4$ relates to the collector layer to be formed. Second portions from $X_1$ to $X_4$ are each aligned to corners from 72c to 72f of the first portion $R_4$. The portion $R_5$ and portion from $Y_1$ to $Y_4$ illustrated in FIG. 16B, the portion $R_6$ and portions from $Z_1$ to $Z_4$ in FIG. 16C, and the portion $R_7$ and portions from $Q_1$ to $Q_4$ in FIG. 16D have similar relation to that illustrated in FIG. 16A and described above.

The manufacturing method of the HBT is thus described as referring to exemplary embodiment. It will be obvious that the invention and its application may be varied in many ways. One alternation is that the length of sides S1 and S3 of portions from T1 to T4 in FIG. 15 are appropriately adjustable. Shapes of the second portions from $T_1$ to $T_4$ are not restricted to the shape illustrated in FIG. 15 and FIG. 16. Moreover, the size of the second portion defined by and depends on characteristics of the collector layer, such as a thickness, a width and a length thereof. Namely, the size and the shape of the etching mask are preferably defined so that the size and the shape of the collector layer to be formed substantially coincide with that of the base layer. The manufacturing method of the present invention is not restricted for the InP-based HBT but for the GaAs-Based HBT formed on the GaAs substrate and uses the combination of AlGaAs emitter layer and GaAs base layer.

Further, the method of the etching for the respective films are exemplary and the process are not restricted to the described method. Although semiconductor films are grown by the MOCVD, the method of the growing is not restricted. Another method, such as Chemical Beam Epitaxy (CBE), is also applicable.

What is claimed is:

1. A hetero-junction bipolar transistor, comprising:
   a semiconductor substrate made of a first compound semiconductor material with a first band gap energy;
   a collector layer made of a second compound semiconductor material with a second band gap energy, the collector layer having a plan shape defined by a first type of sides extending along [011] orientation, a second type of sides extending along [01-1] orientation and a third type of sides extending along [010] orientation shorter than the first type of sides and the second type of sides;
   a base layer made of a third compound semiconductor material with a third band gap energy;
   an emitter layer made of a fourth compound semiconductor material with a fourth band gap energy;
   wherein the third band gap energy of the base layer is smaller than the second band gap energy and the fourth band gap energy.

2. The hetero-junction bipolar transistor according to claim 1, wherein the base layer further has a plan shape defined by a fourth type of sides extending along [011] orientation, a fifth type of sides extending along [01-1] orientation, a sixth type of sides extending along [010] orientation, and wherein a ratio of a length of the third type of sides of the collector layer to a length of the sixth type of sides of the base layer is greater than 0.9 and smaller than 1.5.

3. The hetero-junction bipolar transistor according to claim 1, wherein the second semiconductor material and the fourth semiconductor material are InP, and the third semiconductor material is InGaAs.

4. A hetero-junction bipolar transistor, comprising:
   a semiconductor substrate made of a first semiconductor material, the substrate having a first region and a second region on a primary surface;
   a collector layer formed in the first region of the substrate and made of a second semiconductor material with a first band gap energy, the collector layer being defined by a first type of sides extending along [011] orientation, a second type of sides extending along [011] orientation and a third type of sides extending along [010] orientation;
   a base layer formed in the second region of the substrate and made of a third semiconductor material with a second band gap energy smaller than the first band gap energy; and
   an emitter layer made of fourth semiconductor material with a third band gap energy greater than the second band gap energy of the base layer, the emitter layer formed on the substrate,
   wherein the second region is substantially same as the first region.

* * * * *